United States Patent [19]

Wartusch et al.

[11] 4,212,912

[45] Jul. 15, 1980

[54] ADHESION IMPARTING LAYER OF ACRYLONITRILE-BUTADIENE COPOLYMER ON A BASE MATERIAL FOR PRINTED CIRCUITS

[75] Inventors: Johann Wartusch, Vellmar; Helmut Fasbender, Kassel, both of Fed. Rep. of Germany

[73] Assignees: Licentia Patent-Verwaltungs-G.m.b.H., Frankfurt am Main; AEG Isolier- und Kunststoff GmbH, Kassel-Waldau, both of Fed. Rep. of Germany

[21] Appl. No.: 777,700

[22] Filed: Mar. 15, 1977

[30] Foreign Application Priority Data

Mar. 24, 1976 [DE] Fed. Rep. of Germany ....... 2612438

[51] Int. Cl.$^2$ ................................................ C23C 3/02
[52] U.S. Cl. .................................... 428/209; 174/68.5; 427/98; 428/413; 428/462; 428/463; 428/521; 428/522; 428/901

[58] Field of Search .................... 526/23, 57; 428/901, 428/209, 413, 462, 463, 521, 522; 427/98, 344, 355; 174/68.5

[56] References Cited

U.S. PATENT DOCUMENTS 3,737,339  6/1973  Alsberg et al. ....................... 427/98

OTHER PUBLICATIONS

Kirk-Othmer, "Encyclopedia of Chemical Technology", vol. 14, pp. 812, 813, 1967.
"Rubber Technology", 2nd ed., Van Nostrend Rheinhold Co., pp. 302-313, 7-1973.

*Primary Examiner*—John D. Smith
*Attorney, Agent, or Firm*—Spencer & Kaye

[57] ABSTRACT

Adhesion imparting layer applied to an insulating material serving as a base material in the production of printed circuit boards. The adhesion imparting layer consists essentially of an elastomer of acrylonitrile-butadiene copolymer cross-linked with an organic peroxide.

7 Claims, No Drawings

ADHESION IMPARTING LAYER OF ACRYLONITRILE-BUTADIENE COPOLYMER ON A BASE MATERIAL FOR PRINTED CIRCUITS

BACKGROUND OF THE INVENTION

The present invention relates to an adhesion imparting layer which is applied to an insulating material serving as the base for printed circuits, particularly a laminated plastic, and which can be used for the additive technique as well as for the subtractive technique of making printed circuits. The adhesion imparting layer is, for example, used to adhesively attach a metal layer, such as copper, to the insulating base material.

It is known to produce adhesion imparting layers for such purposes where the layers contain a rubber to which a resin has been added. In particular, these layers contain acrylonitrile-butadiene rubber (NBR) which is caused to react under heat substantially with phenol formaldehyde resins. Further, suitable resins as well as fillers and rubbers other than NBR may serve to modify the layer.

It is also known to use NBR together with multifunctional modified polyols and multifunctional isocyanates which form a polyurethane in order to obtain an adhesion imparting layer.

The known processes produce problems in some respects. For example, the reaction between the rubber and the phenol resin does not take place at the desired speed, which is consistent with the fact that it is known that the resin vulcanization of rubbers takes a long time. It is possible to accelerate this reaction, principally by the use of accelerating additives, but the possible acceleration of this reaction cannot be used, if, as is often the case, the accelerating additives have a negative effect on the further process steps employed in the additive technique, e.g., poisoning of the baths, or if the accelerating additives adversely affect the electrical properties of the printed circuit.

On the other hand, the process of hardening with phenol resin must not be continued too far since otherwise the subsequent surface roughness effected by means of etching baths will no longer be sufficient, with the consequence of incomplete metallization or poorer adhesion of the metal on the substrate.

In the case of the NBR-polyol-isocyanate compositions which lead to a polyurethane, their stability with respect to the various acid or base treatment baths which are used in subsequent steps of the manufacture of the printed circuit must be considered. Furthermore, there is the danger with some substances from this class that they soften too much during the soldering steps which are performed subsequently in the manufacture of the printed circuit.

Most of all, however, the above-mentioned adhesion imparting layers have substantial drawbacks in those cases where the base material has a completely different cross-linking system which is not compatible with the adhesion imparting layer. Thus, for example, a copper foil provided with an adhesion imparting layer of an acrylonitrile-butadiene (nitrile) rubber-phenol resin often exhibits insufficient adhesion after being pressed together with the components of the base material such as reinforcement layers which have been impregnated with unsaturated polyester resins. This drawback becomes particularly apparent if the adhesion imparting layer and the base material are processed into a pressed laminate in a single process step. The reason for this is probably that in this type of processing, the components of the phenol containing adhesion imparting layer have an inhibiting effect on the cross-linking of the unsaturated polyester resin which contains peroxides.

It is also known to use thermoplastic ABS polymers as an adhesion imparting layer. Such thermoplastic adhesion imparting agents are not suited for the production of printed circuit boards because the adhesion on the conventional base material is usually unsatisfactory and because under increased heat stresses, e.g., during soldering, they soften too much.

SUMMARY OF THE INVENTION

It is therefore an object of the present invention to produce a flexible adhesion imparting layer which is present in a uniform layer over the entire layer of the base material of a printed circuit board.

A further object of the present invention is to provide an adhesion imparting layer which has a sufficient cross-linking speed and which can be adapted in its chemical properties to technological advances, particularly with respect to hardness and decomposability.

Another object of the present invention is to provide an adhesion imparting layer which is compatible with the cross-linking system of the base material.

Additional objects and advantages of the present invention will be set forth in part in the description which follows and in part will be obvious from the description or can be learned by practice of the invention. The objects and advantages are achieved by means of the products, processes, instrumentalities and combinations particularly pointed out in the appended claims.

To achieve the foregoing objects and in accordance with its purpose, the present invention, as embodied and broadly described, provides an adhesion imparting layer which is applied to an insulating material serving as a base material in the production of a printed circuit board, wherein the layer consists essentially of an elastomer of an acrylonitrile-butadiene copolymer cross-linked with an organic peroxide.

Preferably, the organic peroxide is an alkyl, cycloalkyl or aralkyl peroxide.

In contradistinction to the know adhesion imparting agents of resin modified rubbers, the layer according to the present invention consists exclusively, except for the possible addition of a mineral filler, of a binder of nonmodified elastomer and does not contain a resin modifier.

Since the adhesion imparting layer of the present invention consists exclusively of a uniform elastomer as binder and is not a mixture with another binder component which is distributed in the adhesion imparting layer, many problems which may occur with the known adhesion imparting agents of resin-rubber mixtures are eliminated in the practice of the present invention. For example, the known adhesion imparting layers tend to form zones of inhomogeneous mixtures which jeopardize uniform adhesion over the entire surface. This is particularly the case if the components of the mixture exhibit incompatibilities or uneven mixing. This problem of an inhomogeneous mixture is avoided in the practice of the present invention.

In addition, the present invention permits setting of a sufficient hardening speed in the cross-linking process of the adhesion imparting layer. Moreover, overhardening of the adhesion imparting layer can be prevented by suitable selection and level of the added cross-linking agent. Further, the present invention assures a cross-linked and thus heat-stable adhesion imparting layer.

It is to be understood that both the foregoing general description and the following detailed description are exemplary, but are not restrictive of the invention.

DETAILED DESCRIPTION OF THE INVENTION

In the practice of the present invention, the adhesion imparting layer consists exclusively of a binder of a nonmodified elastomeric acrylonitrile-butadiene copolymer which is cross-linked with an organic peroxide. The proportion of acrylonitrile in the copolymer may fluctuate within a wide range and preferably is between about 18 to 41 weight percent of the copolymer. Advantageously, a proportion of 38 weight percent acrylonitrile is used in order to assure sufficient roughening of the adhesion imparting layer etching agents.

The organic peroxide which is used to cross-link the copolymers preferably is an alkyl, cycloalkyl or aralkyl peroxide. An especially preferred cross-linking agent is 1,3-bis(t-butylperoxyisopropyl)benzene. The cross-linking agent can be used in an amount of 0.5 to 5.0%, preferably 2% by weight of the copolymer.

Other peroxides to be used include alkylperoxides as
2,5-Dimethyl-2,5-di(t-butylperoxy)hexane,
2,2-Dimethyl-2,5-di(t-butylperoxy)hexyne-3,
  cycloalkylperoxides as
3,3,5-Trimethyl-di-(t-butylperoxy)cyclohexane
  or aralkylperoxides such as
Dicumylperoxide, Tert-butyl-cumylperoxide and
1,3-Bis-(tert.-butylperoxyisopropyl)benzene.

The time-temperature relationship for curing depends on the type of used peroxide and should amount to 5 or 6 half lives of decomposition. Thus, for example 20 minutes at 160° C. is sufficient for curing.

The cross-linking speed in the adhesion imparting composition according to the invention is substantially greater than in a cross-linking process in which phenol resin is used instead of the peroxide cross-linking agent. Thus, an adhesion imparting layer of an acrylonitrile-butadiene copolymer in accordance with the present invention and containing 2% peroxide will be 50% cross-linked after about 10 minutes at a hardening temperature of 160° C. In contrast, an adhesion imparting layer comprised of the same acrylonitrile-butadiene copolymer rubber, but which is to be hardened with phenol resin, shows no noticeable cross-linking under the same time and temperature conditions.

In parallel with an increase in cross-linking speed, the adhesion imparting layer of the present invention exhibits a greater cross-linking density which is manifest in improved adhesion of the metal on the base material.

Mineral fillers may also be added to the adhesion imparting layer. It is advisable, however, to take care that the fillers do not adversely influence cross-linking, which may occur, for example, with acid fillers. The mineral fillers can be added in amounts of 5 to 60% by weight of the copolymer. Suitable mineral fillers include calciumcarbonate, talc and clay, especially the calcinated and surface coated types.

A composition which has been found to be particularly suitable as an adhesion imparting layer in accordance with the present invention contains 100 parts by weight acrylonitrile-butadiene rubber, containing 38% acrylonitrile, and 2 parts by weight 1,3-bis(t-butylperoxyisopropyl)benzene.

An advantageous production of the adhesion imparting layer with a base material can be effected by applying the adhesion imparting layer in a known manner to a transfer foil and then pressing it into a laminate with a stack of layers which are impregnated with a hardenable resin and which serve as the components of the base material. In this process, penetration into the adhesion imparting layer of oxygen from the air is substantially avoided and thus the possibility of an adverse effect on the peroxidic cross-linking is substantially avoided.

The adhesion imparting layer according to the invention is not only of significance for the additive technique, but also for the production of copper-coated base materials which are processed into printed circuit boards according to the subtractive technique. The known copper foils, which are usually oxidized on one side and which are used for lamination, can be coated with an adhesion imparting layer according to the present invention and can be pressed onto various substrates which serve as base materials and, as has been found in tests, such a procedure produces excellent adhesion.

The adhesion imparting composition of the present invention can also be applied with a solvent to a substrate serving as a transfer foil, e.g., onto an aluminum foil. After evaporation of the solvent, the adhesion imparting layer is applied together with the transfer foil to the components of a base material comprised of a stack of paper or woven glass layers which have been impregnated with an epoxy resin or a phenol resin into a so-called prepreg, and the resulting assembly is pressed in a known manner into a laminate.

It has been surprisingly found that when phenolic binders are used in the base material, the cross-linking of the adhesion imparting layer of the present invention is practically not at all influence, which is probably due to the use of alkyl, cycloalkyl or aralkyl peroxides as the cross-linking agent.

A particularly advantageous combination for the adhesion imparting layer and the base material is one in which both the adhesion imparting layer and the adjacent layer of the base material are hardened with peroxide.

Good adhesion of the applied metallization is realized, for example, with the use of a peroxidically cross-linkable adhesion imparting layer of acrylonitrile-butadiene (nitrile) rubber, which is pressed together with peroxidically cross-linkable unsaturated polyesters in the base material.

A base material comprised of an epoxy resin base and containing an acrylonitrile-butadiene copolymer composition according to the present invention as an adhesion imparting layer, after decomposition with oxidizing acid and subsequent to an electroless copper deposition, resulted in an adhesion of the copper of 60 to 150 N/25 mm. The requirement for solder bath stability was met completely with such a structure, i.e., at a stress of 260° C., no loosening or chipping off due to softening occurred.

It will be understood that the above description of the present invention is susceptible to various modifications, changes and adaptations, and the same are intended to be comprehended within the meaning and range of equivalents of the appended claims.

What is claimed is:

1. In the combination of an insulating material, serving as a base material in the production of a printed circuit board, the base material being comprised of an epoxy resin, or of a phenolic resin, an adhesion imparting layer thereon, and a copper metallic layer on the adhesion imparting layer, the improvement wherein the adhesion imparting layer consists essentially of an elastomer of an acrylonitrile-butadiene copolymer cross-linked with an organic peroxide.

2. The combination as defined in claim 1, wherein the organic peroxide is an alkyl, cycloalkyl or aralkyl peroxide.

3. The combination as defined in claim 2, wherein the organic peroxide is 1,3-bis(t-butylperoxyisopropyl)benzene.

4. The combination as defined in claim 1, wherein the elastomer of acrylonitrile-butadiene copolymer contains 38% acrylonitrile.

5. The combination as defined in claim 1, wherein the layer contains a mineral filler.

6. The combination as defined in claim 1, wherein the insulating material is a pressed laminate.

7. The combination as defined in claim 1 wherein the base material is comprised of an epoxy resin and the adhesion imparting layer has an adhesion value of 60 to 150 N/25 mm.

* * * * *